US012232340B2

(12) United States Patent
Azoulay et al.

(10) Patent No.: US 12,232,340 B2
(45) Date of Patent: Feb. 18, 2025

(54) INFRARED DETECTION WITH INTRINSICALLY CONDUCTIVE CONJUGATED POLYMERS

(71) Applicants: The University of Southern Mississippi, Hattiesburg, MS (US); Government of the United States, as represented by the Secretary of the Air Force, Wright-Patterson AFB, OH (US)

(72) Inventors: Jason D. Azoulay, Hattiesburg, MS (US); Jarrett Vella, New Carlisle, OH (US); Mohammed I. Vakil, Beavercreek, OH (US); Lifeng Huang, Hattiesburg, MS (US); Naresh Eedugurala, Hattiesburg, MS (US)

(73) Assignees: The University of Southern Mississippi, Hattiesburg, MS (US); Government of the United States, as represented by the Secretary of the Air Force

( * ) Notice: Subject to any disclaimer, the term of this patent is extended or adjusted under 35 U.S.C. 154(b) by 388 days.

(21) Appl. No.: 17/390,277

(22) Filed: Jul. 30, 2021

(65) Prior Publication Data
US 2022/0037408 A1      Feb. 3, 2022

Related U.S. Application Data

(60) Provisional application No. 63/059,454, filed on Jul. 31, 2020.

(51) Int. Cl.
*H10K 39/32*     (2023.01)
*H10K 30/81*     (2023.01)
(Continued)

(52) U.S. Cl.
CPC ............. *H10K 39/32* (2023.02); *H10K 30/81* (2023.02); *H10K 30/88* (2023.02); *H10K 71/12* (2023.02); *H10K 85/113* (2023.02); *H10K 85/151* (2023.02)

(58) Field of Classification Search
CPC ........ H10K 39/32; H10K 30/88; H10K 30/81; H10K 71/12; H10K 85/113; H10K 85/151
See application file for complete search history.

(56) References Cited

U.S. PATENT DOCUMENTS 4,347,436 A * 8/1982 Fukuda ................. H01L 31/095
                                             257/E31.124
7,972,885 B1 * 7/2011 Dutta .................. H01L 31/0352
                                             257/E21.189
(Continued)

FOREIGN PATENT DOCUMENTS

EP        2797635 B1    5/2020
WO   WO-2011076324 A1 *  6/2011   ......... H01L 51/0003
(Continued)

OTHER PUBLICATIONS

London, A et al. "A high-spin ground-state donor-acceptor conjugated polymer" Sci. Adv. May 24, 2019;5(5):eaav2336.
(Continued)

*Primary Examiner* — David P Porta
*Assistant Examiner* — Fani Polyzos Boosalis
(74) *Attorney, Agent, or Firm* — Butler Snow LLP

(57) ABSTRACT

A photoconductive infrared detector comprising a substrate, an electrode geometry, and a layer of intrinsically conductive or photoconductive donor-acceptor conjugated polymer.

23 Claims, 14 Drawing Sheets

(51) Int. Cl.
*H10K 30/88* (2023.01)
*H10K 71/12* (2023.01)
*H10K 85/10* (2023.01)

(56) References Cited

U.S. PATENT DOCUMENTS

| | | | |
|---|---|---|---|
| 8,809,487 | B2 | 8/2014 | Seferos et al. |
| 9,623,123 | B2 | 4/2017 | Liu |
| 2003/0062480 | A1 | 4/2003 | Kanzaki |
| 2004/0187917 | A1 | 9/2004 | Pichler |
| 2006/0269664 | A1 | 11/2006 | Gleason et al. |
| 2010/0230607 | A1* | 9/2010 | Kitada .................. G01T 1/241 250/370.08 |
| 2011/0028656 | A1 | 2/2011 | Bazan et al. |
| 2011/0049367 | A1 | 3/2011 | Forrest et al. |
| 2015/0014627 | A1* | 1/2015 | Yu ........................ H10K 10/29 257/77 |
| 2017/0324901 | A1 | 11/2017 | Invisage |
| 2019/0194385 | A1 | 6/2019 | Azoulay et al. |
| 2020/0052216 | A1 | 2/2020 | Mitchell et al. |

FOREIGN PATENT DOCUMENTS

| | | | | |
|---|---|---|---|---|
| WO | WO-2015067335 A1 * | 5/2015 | ............ | G06F 21/32 |
| WO | 2017078302 A1 | 5/2017 | | |
| WO | 2020072100 A1 | 4/2020 | | |

OTHER PUBLICATIONS

Vella. J et al. "Broadband infrared photodetection using a narrow bandgap conjugated polymer" Sci. Adv. Jun. 9, 2021;7(24):eabg2418.

* cited by examiner

INFRARED DETECTION WITH INTRINSICALLY CONDUCTIVE CONJUGATED POLYMERS

CROSS-REFERENCE TO RELATED APPLICATIONS

This application claims priority to U.S. Application No. 63/059,454 to Jason D. Azoulay et al. filed on Jul. 31, 2020, the contents of which are incorporated herein by reference in its entirety.

STATEMENT OF FEDERALLY SPONSORED RESEARCH OR DEVELOPMENT

This invention was made with government support under Contract No. FA9550-17-1-0261 then FA9550-20-1-0353 awarded by the U.S. Air Force Office of Scientific Research (AFOSR), Contract No. OIA-1632825 awarded by the National Science Foundation (NSF), and Cooperative Research and Development Agreement (CRADA) No. 20-061-RY-02. The government has certain rights in the invention.

FIELD OF THE INVENTION

This invention relates generally to the field of infrared (IR) electromagnetic radiation detection and, more particularly, to novel photoconductive infrared detectors made with novel donor-acceptor conjugated polymers, where the polymer is attached and/or coated and applied to electrical circuits. Irradiation with infrared light results in a change in current registered in the electrical circuit.

BACKGROUND OF THE INVENTION

Photodetection in the shortwave to longwave infrared region of the electromagnetic spectrum underpins many modern-applications, including industrial, scientific, energy, medical, and defense applications. Detection devices for this band of frequencies rely on separate narrow bandgap semiconductors such as lead salts, single crystalline materials, III-V semiconductors, binary alloys, and the like. Despite the maturity of these technologies, complex manufacturing processes, high costs, and low temperature of operation requirements remain problematic and prohibitive for many applications. Synthetic limitations have restricted the functionality of polymer-based infrared detectors to the near-infrared region (<1.5 μm).

Contemporary shortwave infrared (SWIR, $\lambda=1.0$ μm-3.0 μm) and midwave infrared (MWIR, $\lambda=3.0$ μm-5.0 μm) detection is accomplished using III-V semiconductors such as indium gallium arsenide (InGaAs, $\lambda=0.9$ μm 1.7 μm), indium antimonide (InSb) which, when doped, forms a photodiode sensitive to wavelengths between $\lambda=1.0$ μm-5.0 μm, and mercury cadmium telluride (MCT, $\lambda=8$ μm-14 μm). These semiconductors must be cryogenically cooled to increase the signal-to-noise ratio (SNR), indium bump-bonded to a readout integrated circuit (ROIC), and fashioned from a single crystal. Salts such as lead selenide (PbSe) and lead sulfide (PbS) are photoconductive SWIR-MWIR detectors that can operate at room temperature or can be cooled. Lead salt detectors are commonly fabricated by precipitation onto the surface of a substrate. Longwave infrared (LWIR, $\lambda=8.0$ μm-14.0 μm) detection is dominated by mercury-cadmium-telluride (MCT), which can function as a photodiode or a photoconductor. It also must be cryogenically cooled and indium bump-bonded to a ROIC.

Infrared detectors made of InSb and MCT require expensive cryogenic cooling and, because the sensing element must be a single crystal, cannot be fabricated into large areas and are extremely expensive. Imaging devices made from these materials have to be hybridized to the ROIC before incorporation into the detector back end. Lead salts, because they are precipitated by a chemical reaction onto the substrate, have issues with film uniformity, chemical purity, and electronic defects. Current alternatives to contemporary SWIR-LWIR detectors involve complicated and largely impractical optical arrangements. Moreover, bulk heterojunction diodes are fundamentally limited by the absorption spectrum of conjugated polymers, which is often based in the visible ($\lambda=500$ nm-780 nm) or near-infrared ($\lambda=780$ nm-1000 nm) regions, and they are inherently inefficient.

SUMMARY OF THE INVENTION

The infrared detector disclosed herein may be configured to use intrinsically conductive or photoconductive, conjugated polymers to address the need in the art for a low-cost, uncooled SWIR-LWIR detector that does not require indium bump-bonding. Further, the detector may be chemically pure with a primary energy gap in the SWIR region and broad electronic absorption extending into the LWIR spectrum.

In some embodiments, at least one electrically conductive transmission line may be fabricated on a dielectric substrate. In the center of the transmission line is a gap, resulting in two transmission lines. The size of the gap is determined by the application but is generally less than about 1.0 mm. This configuration forms one pixel. The transmission lines typically run edge-to-edge across the substrate in a straight line. On the terminus of each of the transmission lines proximate the substrate edge is a contact pad with an edge length no smaller than about 1.0 mm. A polymer is spin-coated on top of the transmission lines, coating the transmission lines, gap, pads, and the entire substrate. The polymer is removed from the contact pads, followed by encapsulation of the polymer over the transmission line gap.

In some embodiments, the polymer is deposited using oxidative chemical vapor deposition instead of spin-coating.

Infrared radiation focused in the vicinity of the transmission line gap is absorbed by the polymer, generating holes and electrons. When an external DC electric bias is applied across the gap, the charge carriers drift to the appropriate electrode. This forms a photocurrent, which can be collected, amplified, filtered, and digitized.

In some embodiments, multiple pixels are arranged in an m×n-dimensional array to form a linear detector or pushbroom sensor. In some embodiments, an m×n-dimensional array is created using a readout integrated circuit (ROIC).

Additional objects, advantages, and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly described in the attached document and the appended embodiments.

BRIEF DESCRIPTION OF THE DRAWINGS

The accompanying drawings and those in the attached document, which are incorporated in and constitute a part of this specification, illustrate embodiments of the invention and the advantages and, together with a general description of the invention given above, and the detailed description given below, serve to explain the invention.

DETAILED DESCRIPTION OF THE INVENTION

Figure 1:
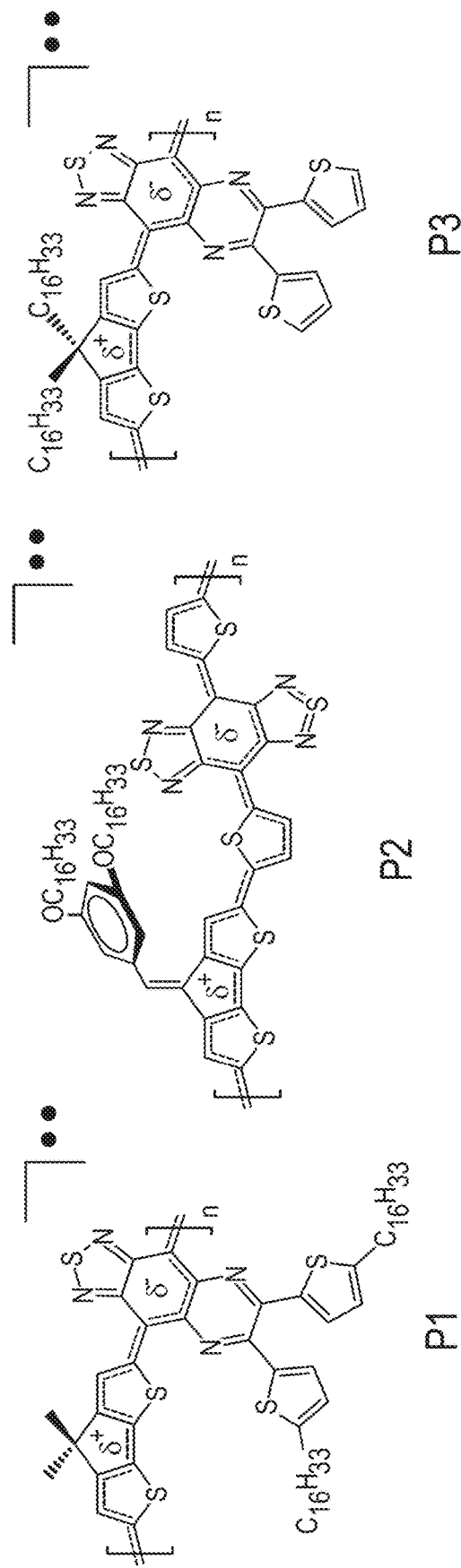
FIG. 1 shows structures of representative donor-acceptor conjugated polymers P1-P5.

As used herein, the following terms will be understood to have the definitions set forth. "Open-shell character" generally refers to molecules with diminished intramolecular electron pairing (i.e., unpaired electrons) and characteristic electron paramagnetic resonance (EPR) signal and characteristic magnetization signal in a superconducting quantum interference device (SQUID) magnetometer or any instrument capable of direct magnetization measurement. In other words, "open-shell character" in a material is defined as exhibiting: 1) diradical character ($y_0$) or multiple diradical character ($y_{1,2,3}$ . . . ); 2) Characteristic electron paramagnetic resonance (EPR) signal, and/or characteristic magnetization signal in a superconducting quantum interference device (SQUID) magnetometer or any instrument capable of direct magnetization measurement. Values of $y_1$ and EPR signal intensity are dependent on the bandgap, the difference between the singlet and triplet energy levels ($\Delta E_{ST}$) and ultimately dictated by the polymer structure. "Bandgap" generally refers to the energy gap between the highest occupied molecular orbital (HOMO) and the lowest unoccupied molecular orbital (LUMO). "Intrinsic conductivity" generally refers to the electrical conductivity measured from a pure material without external additives and/or dopants.

The invention provides the first utilization/examples of infrared photodetection employing donor-acceptor (DA) conjugated polymer active layers with broadband operation throughout the short-, mid-, and long-wavelength infrared regions. The polymers exhibit strongly correlated electronic structures, very narrow bandgaps, long-wavelength absorption, intrinsic electrical conductivity, and solution-processability. The present disclosure generally discloses fabricated separate, monolithic photoconductive detectors that demonstrate blackbody-induced photocurrents between about 4.5 to 65 pA at room temperature, depending on the polymer used and the infrared spectral region, but consistent with the absorption of the polymer. The invention provides a fundamentally new platform for low cost, ambient temperature infrared detection and optoelectronics.

While most conventional conjugated polymers are closed-shell species accommodating their π-electrons in bonding orbitals, DA copolymers with quinoidal character, extended π-systems, and narrow bandgaps demonstrate open-shell electronic structures. As disclosed herein, modular, solution-processed conjugated polymers (CPs) with absorption profiles and optical excitations that span technologically relevant wavelength (λ) ranges spanning the NIR-LWIR region and that fit within current large-area processing paradigms can be readily achieved. Such synthetic control has also resulted in novel physical properties, such as ground state electronic structures that can be manipulated, tunable electrical conductivities higher than those of other neutral organic solids, and unique electronic, optical, transient, spin, thermal, and magnetic phenomena not previously measured in soft-matter (polymer) systems. This discontinuity in the structure and the corresponding dynamics of these materials as the bandgap continues to narrow is a manifestation of increasing electron correlations and, similar to their inorganic counterparts, leads to new emergent properties.

Narrow bandgaps afforded through extended conjugation are intimately related to the coexistence of nearly degenerate states, which can be tuned through synthetic design. The unique electronic structures and spin correlated phenomena arising from unpaired electron densities offer richer categories of behavior than in closed-shell CPs. For example, these materials exhibit room-temperature conductivities ($\sigma_{RT}$) ranging from ~$10^{-8}$-10 S cm$^{-1}$ and controlled spin multiplicities emanating from a high degree of electronic coherence along the π-conjugated backbone. In these materials, narrow bandgaps increase configurational admixing, while extension of the π-system promotes topological localization within the macromolecule, diminishing the covalency of the ground state and promoting diradical and even polyradical character. Extensive delocalization further promotes thermodynamic stabilization.

These results disclosed herein are consistent with the emergence of open-shell DA polymers with strong π-correlations that drive the formation of diverse electronic states and open opportunities for the development of new (opto) electronic technologies. The present disclosure further demonstrates that open-shell conjugated polymers can achieve appropriate electrical properties, tunable electrical conductivity, and photoresponsivity in their native forms to function within IR photoconductive detectors.

Photoconductive detectors of the invention were fabricated by spin-coating or oxidative chemical vapor deposition of the polymer(s) onto a substrate pre-patterned with gold electrodes. The electrodes can also be made of any combination of metals and semiconductors that provide a low contact resistance between the electrode material and polymer film. FIG. 1 illustrates five exemplary chemical structures P1-P5 of polymers with open-shell ground states. In other words, P1-P5 may exhibit open-shell ground states, long-wavelength absorption, and intrinsic electrical conductivity. The charge transport in these materials may be associated with the low energetic barrier from narrow bandgap for thermal excitation of free carriers and extensive delocalization. The IR photoconductive polymers are not limited to P1-P5. Additional exemplary structures are disclosed in the previous patents of PCT/US2019/030950 entitled "Open-Shell Conjugated Polymer Conductors, Composites, and Compositions" and U.S. patent application Ser. No. 16/327,770 entitled "Narrow Band Gap Conjugated Polymers Employing Cross Conjugated Donors Useful in Electronic Devices", the contents of which are hereby incorporated by reference.

The photoconductive detector 100 may be configured to be a single channel (one pixel) photoconductive detector, a scanning imager, or as a staring array. The detector 100 may be configured to operate at ambient temperature or may be coupled with a cooling apparatus such as, for example, a Peltier, variable pressure, Sterling, three-stage thermoelectric, two-stage thermo-electric, one-stage thermoelectric, or cryogenic liquid.

Figure 2A:
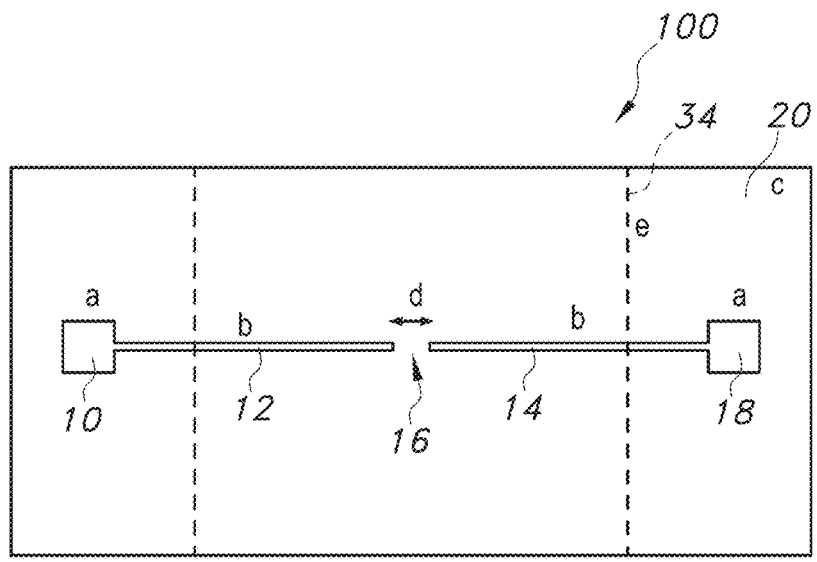
FIG. 2A is a schematic view of a single element, photoconductive detector, according to various examples.

Referring now to FIG. 2A, an exemplary schematic of a photoconductive detector is illustrated having first and second contact pads 10, 18. Each of the first and second contact pads 10, 18 may have an edge length of about 1.0 mm. Each of the first and second contact pads 10, 18 may further be configured to allow for bias application and connection to external circuitry, such as probes and chip carriers. For example, the first and second contact pads 10 may be configured to be used for wire bonding to a ceramic leadless chip carrier (LCC). In various examples, the detector 10 may be electrically coupled with sensor-specific hardware for signal processing, such as pulse capture electronics, cascaded pre-amplifier circuitry, and/or an analog-to-digital converter.

A first transmission line 12 having a length of about 17.5 mm and a width of about 0.2 mm may be connected electrically to the first contact pad 10. A second transmission line 14 is positioned such that an end of the second transmission line 14 is positioned proximate an end of the first transmission line 12. Each end is positioned opposite the respective contact pad 10, 18. The end of the first transmission line 12 is spaced apart from the end of the second transmission line 14 by a gap 16. The gap 16 may be about 60 μm wide. However, it is contemplated that the gap 16 can be any reasonable width (e.g., between about 1 nm and about 1 mm).

The contact pads 10, 18 and the transmission lines 12, 14 may be fabricated on a glass substrate 20. The glass substrate 20 may be borosilicate; however, it is contemplated that the substrate 20 may be any appropriate substrate, including but not limited to, for example, glass, plastic, or silicon. The substrate 20 may be a dielectric substrate. Where the substrate 20 is a dielectric substrate, the electrode geometry of the first and second transmission lines 12, 14 may be biased with an RF or DC potential less than the dielectric breakdown threshold of the substrate 20.

Figure 2B:
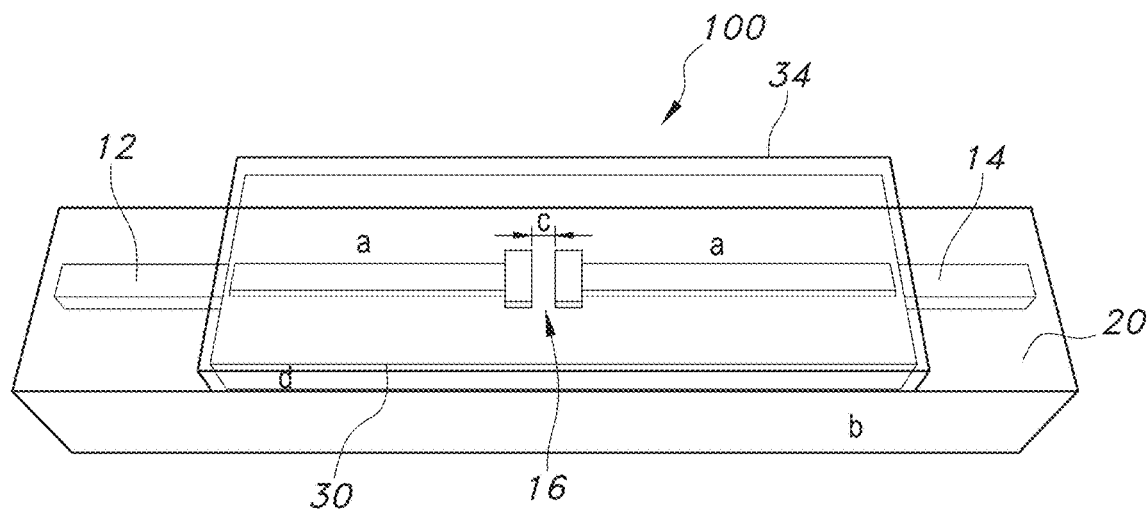
FIG. 2B is a top perspective view of a model of the photoconductive detector of FIG. 2A.

Referring now to FIG. 2B, the photoconductive detector 100 is illustrated having the first and second transmission lines 12, 14 without the first and second contact pads 10, 18. As previously discussed, the first transmission line 12 may have a length of about 17.5 mm and a width of about 0.2 mm. One or both of the first and second transmission lines 12, 14 may be configured to be used for wire bonding to a ceramic leadless chip carrier (LCC). The LCC may have an edge length of about 1.0 mm. As previously discussed, each of the first and second transmission lines 12, 14 may be fabricated on a borosilicate or quartz-coated glass substrate 20. It will be understood that the substrate 20 may be any appropriate substrate, including but not limited to, for example, glass, plastic, or silicon. The first and second transmission lines 12, 14 are spaced apart by the gap 16. The gap 16 may be about 60 μm wide.

Figure 2C:
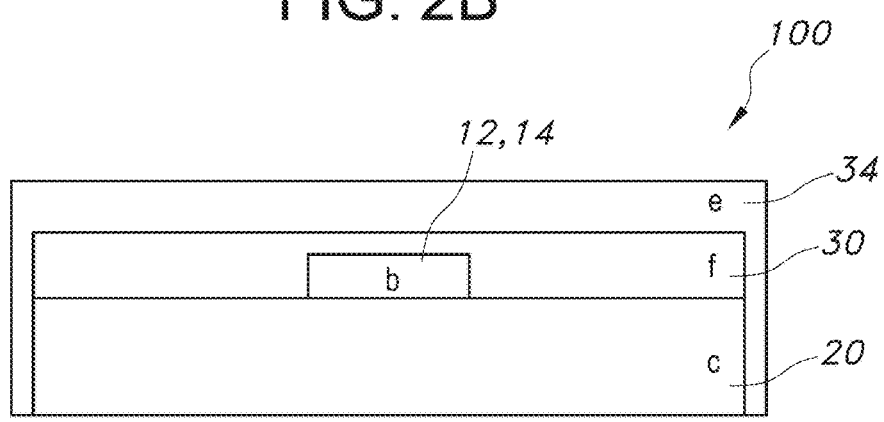
FIG. 2C is a partial cross-sectional view of a single element, photoconductive detector.

As best shown in FIG. 2C, a photoconductive polymer layer 30 may be spin-coated over a portion of or over the entirety of the substrate 20. In various examples, the photoconductive polymer layer 30 may be selected from P1-P5 illustrated in FIG. 1. Alternatively, the photoconductive polymer layer 30 may be any other comparable polymer without departing from the scope of the present disclosure. Referring now to FIGS. 2A-2C, in various examples, the polymer layer 30 may be spin-coated over the portion of or over the entirety of the substrate 20 and may be removed from the first and second contact pads 10, 18 using a solvent-soaked cotton swab. In other examples, the polymer layer 30 may be spin-coated over a portion of or the entirety of the substrate 20 and may be removed from the edges of the first and second transmission lines 12, 14.

A shadow mask may be placed over a wafer such that an encapsulant layer 34 may be evaporated over the center of the photoconductive detector 100 to at least partially cover the transmission lines 12, 14 and the gap 16. The encapsulant layer 34 may have a thickness of about 100 nm and may be configured to act as an encapsulant. In other words, the encapsulant layer 34 may be configured to prevent the polymer layer 30 from degrading due to contact with the atmosphere. The encapsulant layer 34 may be formed of alumina, silica, zinc selenide, germanium, barium fluoride, germanium-arsenide-selenide, gallium arsenide, glass, fused silica ("quartz"), silicon, magnesium fluoride, calcium fluoride, zinc sulphide, magnesium aluminate, or any other suitable material.

A DC bias may be applied across the gap separating the two transmission lines 12, 14. The DC bias may be about +5 V. The gap 16 discussed above with respect to FIGS. 2A-2C may be configured to represent a detector active area. Infrared energy applied to and incident on the active area may be absorbed by the photoconductive polymer, which has a direct electronic bandgap in the SWIR-LWIR region. An electron-hole pair may be created and may be collected by the ends of the transmission lines 12, 14. In various examples, the transmission lines 12, 14 and the contact pads 10, 18 may be made of gold, providing a low resistance, high mobility conduction path for charge carriers. An ultrasonically extruded, gold wire bond can connect either of the contact pads 10, 18 and/or the transmission lines 12, 14 to a LCC. The LCC may in turn be mounted in a printed circuit board connected to a current pre-amplifier and lock-in amplifier and/or may be configured to link the LCC to an electronic backend of the detector 100.

Other possible detector geometries are contemplated, including, but not limited to, a pushbroom-type sensor consisting of pixels arranged in a 1×n format, where n is the number of sensor elements. The length of transmission lines may be varied in sets of three to increase the detector fill factor. Alternatively, the polymer can be spin-coated directly onto a readout integrated circuit (ROIC).

Figure 2D:
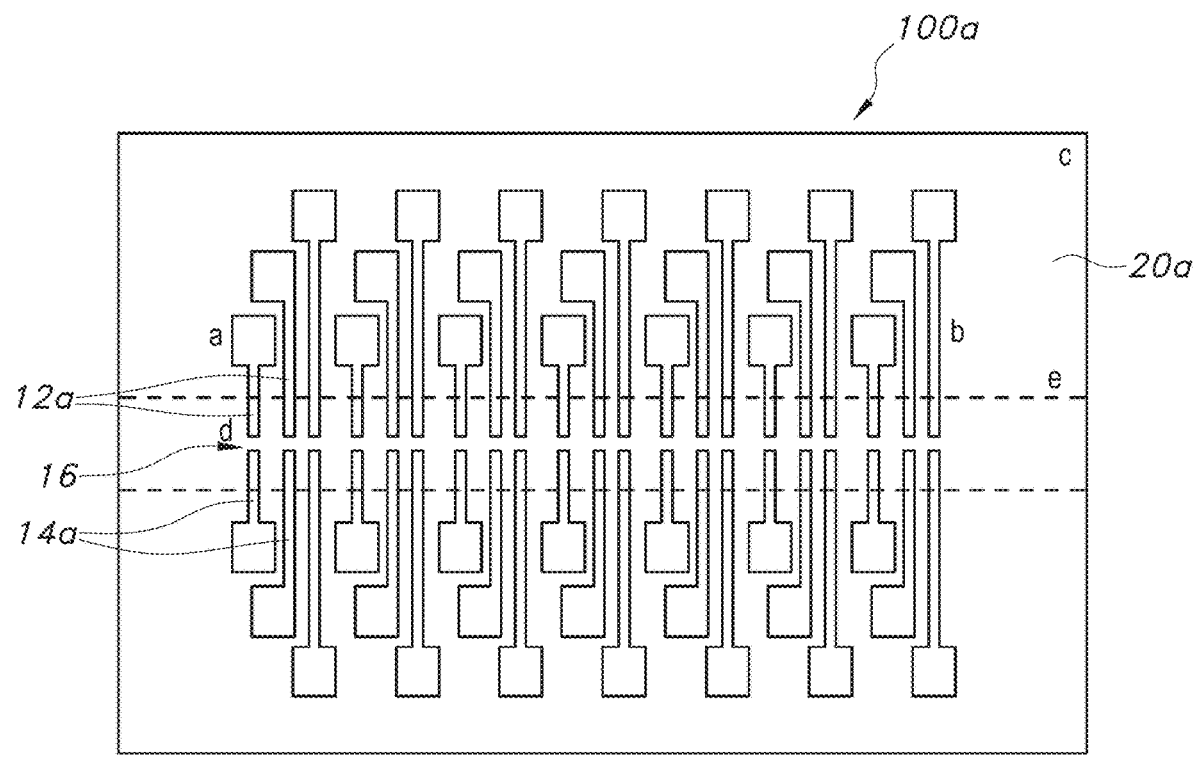
FIG. 2D is a one-dimensional array of photoconductive detectors, according to various examples.

Referring now to FIG. 2D, an exemplary photodetector 100a having an exemplary alternative geometry is illustrated. The photodetector 100a may be configured as a pushbroom-type sensor, consisting of pixels arranged in a 1×21 format. In various examples, the photodetector 100a may be configured to act as a scanning imager or as a staring array.

The photodetector 100a includes transmission lines 12a, 14a, positioned on a substrate 20a and spaced apart by a gap 16a. As previously noted, the length of each of the transmission lines 12a, 14a are varied in sets of three to increase the fill factor of the detector 100a. A polymer 30a may be spin-coated onto an ROIC. It will be understood that the illustrated photodetector 100a is exemplary only and that other geometries and pixel arrangement are contemplated without departing from the scope of the present disclosure.

Figure 2E:
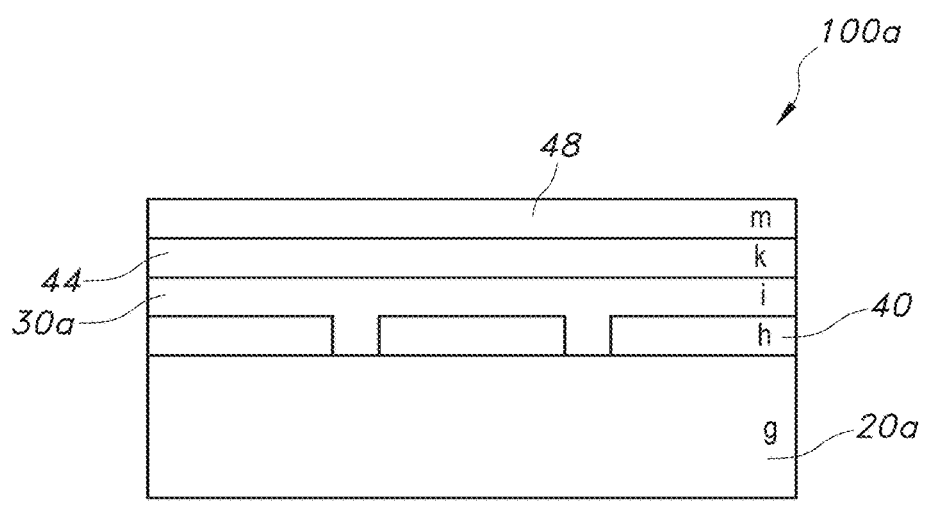
FIG. 2E is a partial cross-sectional view of an m×n dimensional array of photoconductive detectors, according to various examples.

Referring now to FIG. 2E, a partial cross-section of an ROIC substrate 20a fabricated with an m×n dimensional array of ohmic contacts 40 on the substrate 20a. The array of ohmic contacts 40 may be biased with an RF or DC potential less than a dielectric breakdown threshold of the substrate 20a. The array of ohmic contacts 40 may be configured to operate at ambient temperature or may be coupled with a cooling apparatus such as, for example, a Peltier, variable pressure, Sterling, three-stage thermoelectric, two-stage thermo-electric, one-stage thermoelectric, or cryogenic liquid.

The polymer 30a may be spin-coated on top of the array of ohmic contacts 40. An optically transparent electrode covering 44 may be deposited on top of and covering the polymer 30a. The electrode covering 44 may partially cover or entirely cover the polymer 30a. The electrode covering 44 may be configured to act as a second electrode. A transparent insulating material 48 may be applied to encapsulate the detector 100a. Any appropriate transparent insulating material 48 may be used without departing from the scope of the present disclosure.

Figure 3:
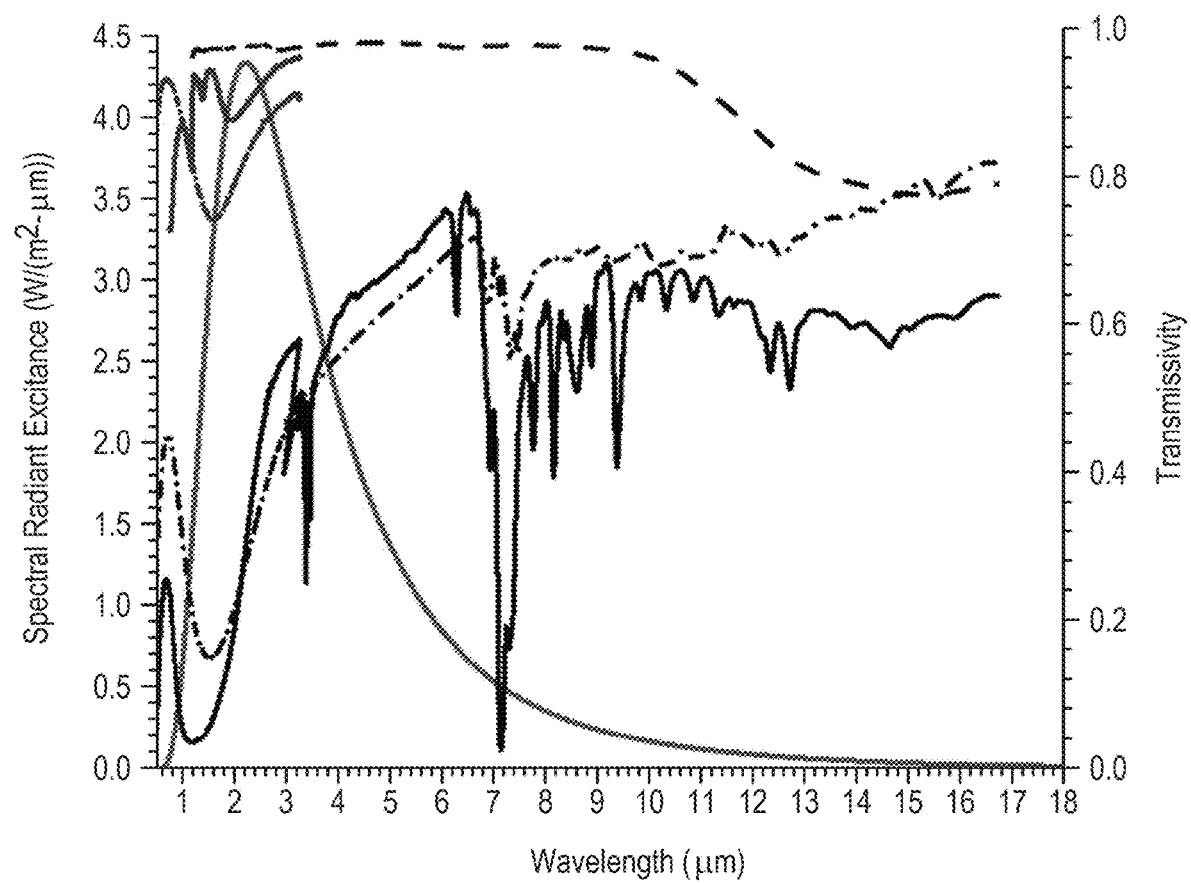
FIG. 3 shows a graphical representation of the radiant excitance of a 1000° C. blackbody radiator overlaid with the transmission spectrum of photoconductive polymers P1 with thickness of ~100 nm, P2 with thickness of ~100 nm, P1 thicker film with thickness of ~1 µm, P2 thicker film with thickness of ~1 µm, and the alumina encapsulant.

Photoconductive detectors using at least exemplary polymers P1 and P2 were tested 10 cm away from a 1000° C. cavity blackbody radiator with a 0.6 in aperture. FIG. 3 illustrates a graphical representation of the radiant exitance of a 1000° C. blackbody radiator (solid green) overlaid with the transmission spectrum of photoconductive polymers P1 with thickness of ~100 nm (dash-dot blue), P2 with thickness of ~100 nm (solid blue), P1 thicker film with thickness of ~1 μm (dash-dot black), P2 thicker film with thickness of ~1 μm (solid black), and the alumina encapsulant (dash black). The calculated radiant exitance featured a maximum intensity at $\lambda=2.29$ μm, compared with absorbance maxima centered at $\lambda=1.65$ μm for P1 and at $\lambda=2.00$ μm for P2, respectively. Both polymers featured longer wavelength absorption tails extending into the LWIR region. The 100 nm thick alumina encapsulant, used to protect the polymers from air, featured high transmissivity throughout the SWIR and MWIR regions, with only slight LWIR attenuation.

Figure 4:
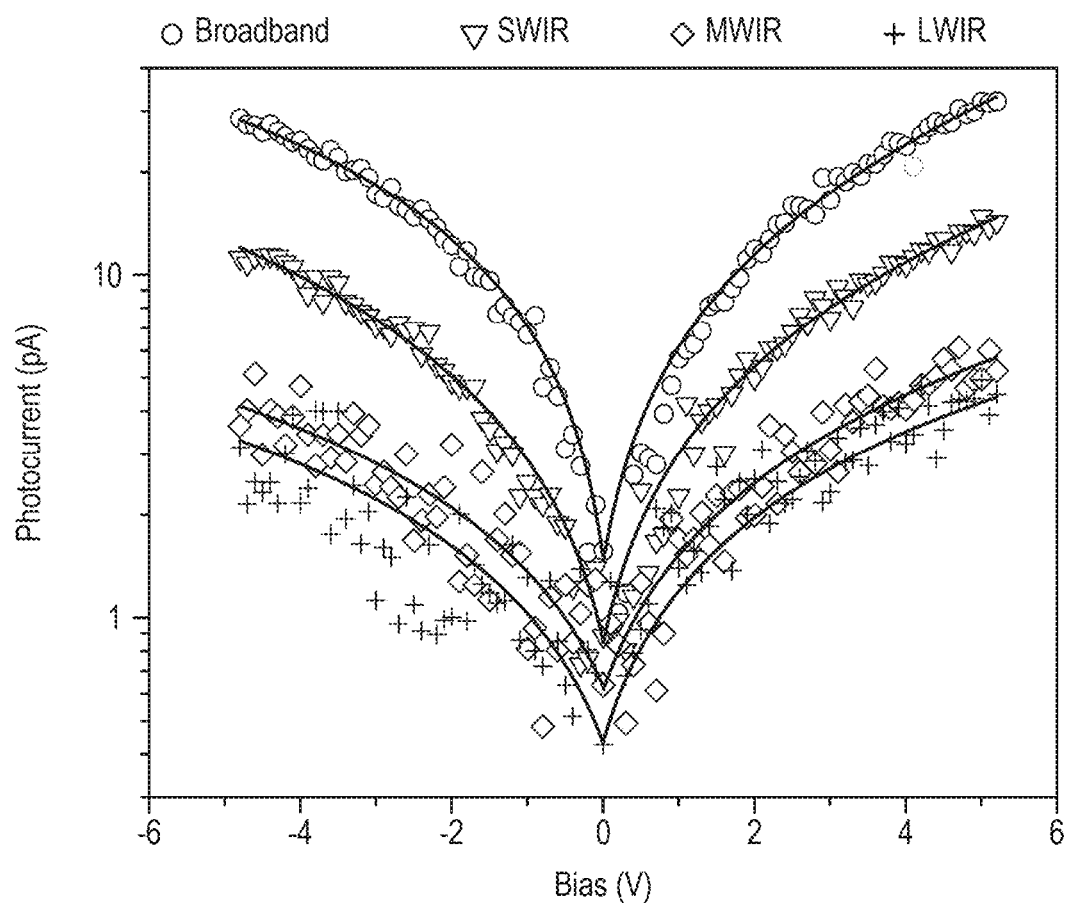
FIG. 4 shows a graphical representation of a photocurrent generated by P1, irradiated with a 1000° C. blackbody, with and without spectral bandpass filters.
Figure 5:
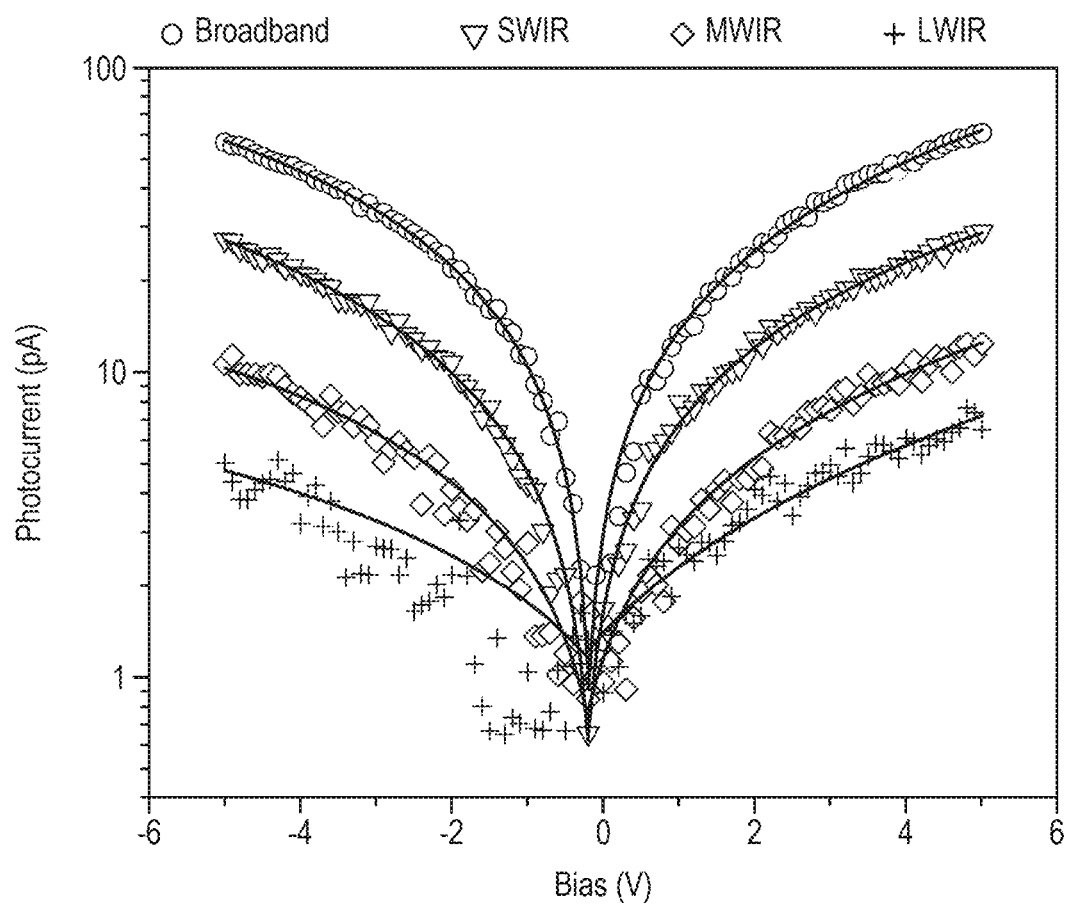
FIG. 5 shows a graphical representation of the photocurrent generated by P2, irradiated with a 1000° C. blackbody, with and without spectral bandpass filters.
Figure 6:
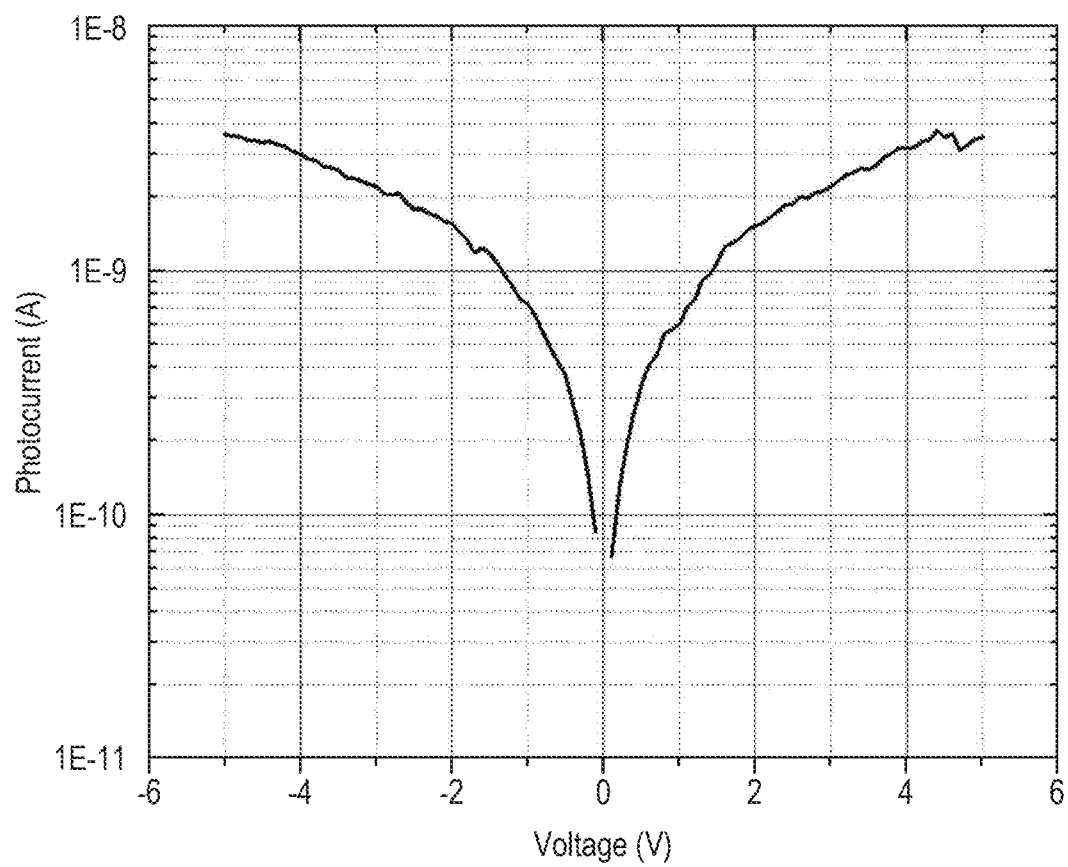
FIG. 6 shows a graphical representation of a photoresponse generated by P3 in response to pulsed lasers of varying frequency as a single wavelength.
Figure 7:
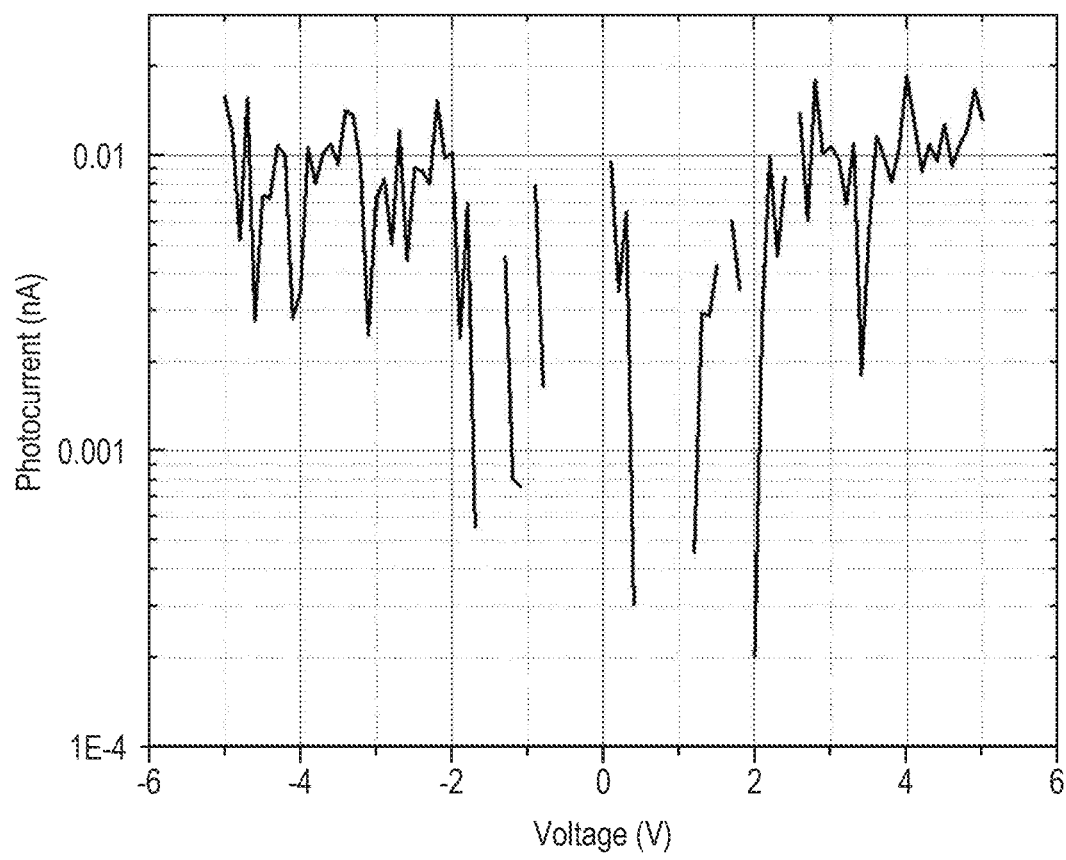
FIG. 7 shows a graphical representation of a photoresponse generated by P4 in response to pulsed lasers of varying frequency as a single wavelength.
Figure 8:
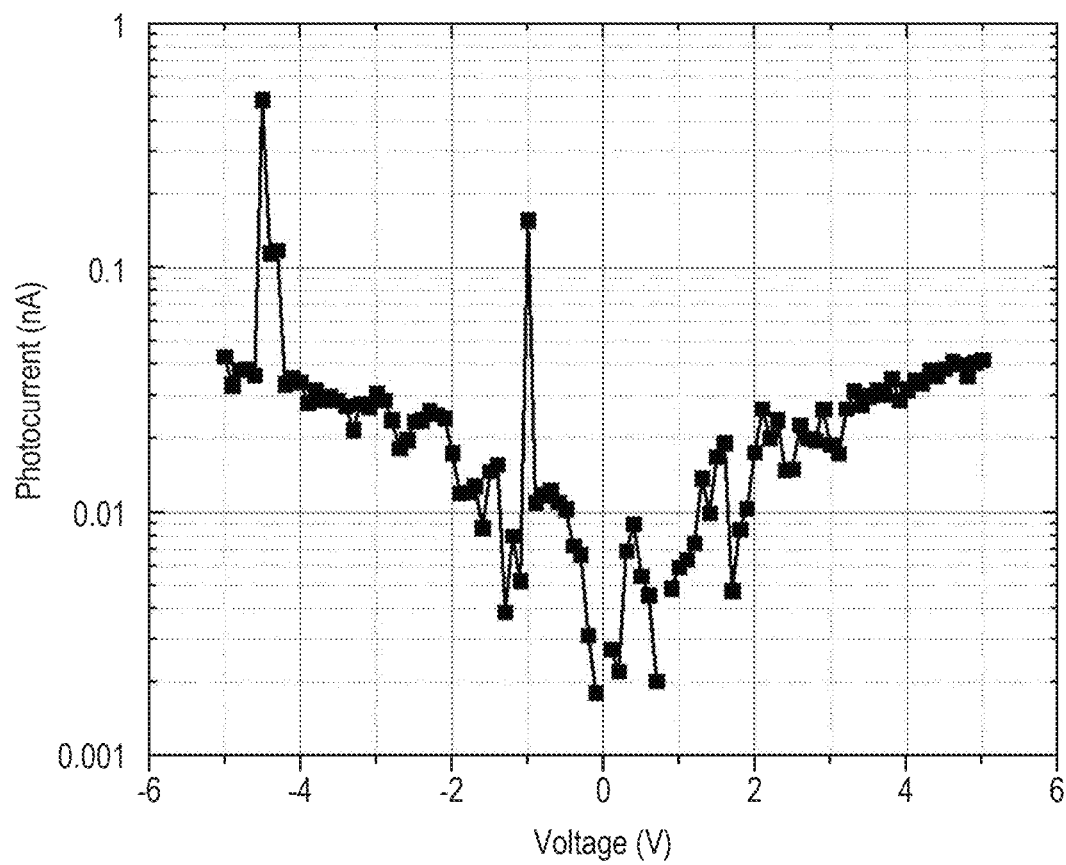
FIG. 8 shows a graphical representation of a photoresponse generated by P5 in response to pulsed lasers of varying frequency as a single wavelength.

Referring now to FIGS. 4 and 5, four current-voltage (IV) curves for at least P1 and P2 were recorded: one without a bandpass filter, and one each with a SWIR bandpass filter ($\lambda=1.1$-3.0 μm), a MWIR filter ($\mu=3$-5 μm) and a LWIR filter ($\lambda=8.0$-11 μm). Clear photocurrents were observed in all four cases. For both polymers P1 (FIG. 4) and P2 (FIG. 5), approximately 40% of the total (unfiltered) photocurrent originated in the SWIR region as expected, around 15% each in the MWIR and LWIR regions, respectively, with the remainder originating in other regions. These detectors were tested using thicknesses of ~100 nm for P1 and P2. For example, the curves for P1 were generated by testing a detector using a thickness of about 76 nm, and the curves for P2 were generated by testing a detector using a thickness of about 102 nm. The optimal film thickness may be dependent on each particular polymer and the wavelength of interest. For example, the film thickness may vary between about 50 nm and 10 μm. However, it is contemplated that the film thickness may be outside this exemplary range. Referring now to FIG. 6-7, pulsed laser irradiation was used with two different frequencies at a wavelength of about 1550 nm. The frequencies used were about 0.5 Hz and about 1.0 Hz. The generated level photocurrent was recorded from using pulsed laser irradiation to test a P3-based photoconductive detector (FIG. 6), a P4-based photoconductive detector (FIG. 7), and a P5-based photoconductive detector (FIG. 8).

Figure 9B:
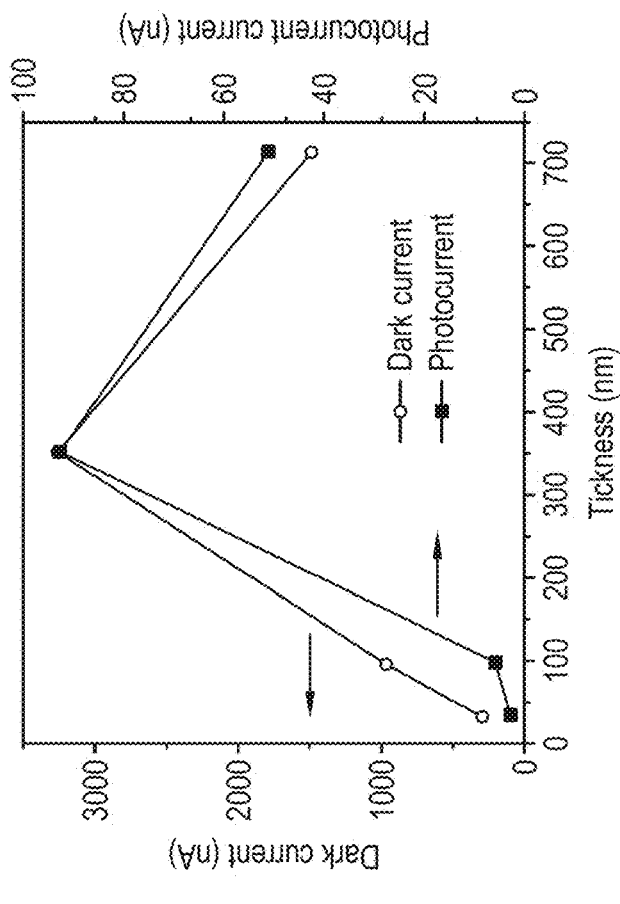
FIG. 9B shows a graphical representation of a photodetector performance of P1 measured by photocurrent and dark current where a substrate of the photodetector is treated.
Figure 9A:
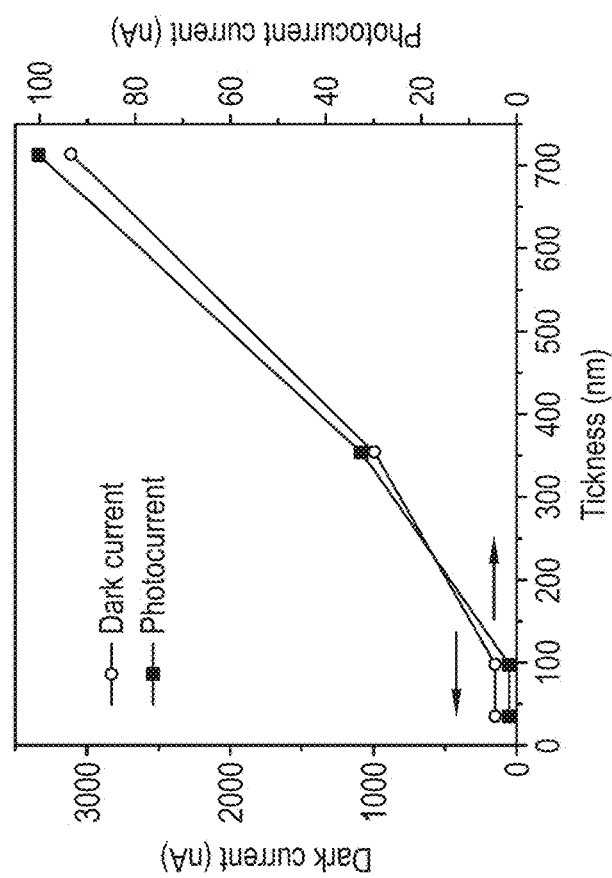
FIG. 9A shows a graphical representation of a photodetector performance of P1 measured by photocurrent and dark current where a substrate of the photodetector is untreated.
Figure 10A:
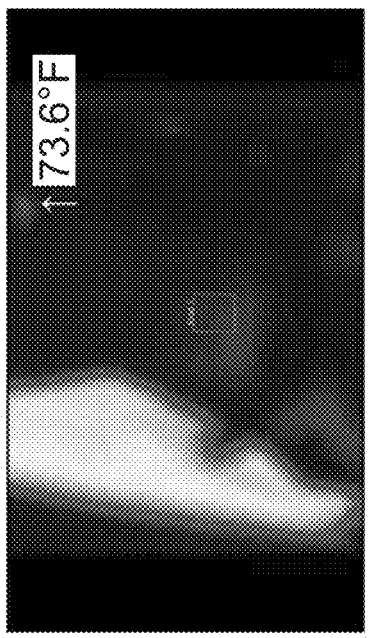
FIG. 10A shows a visual representation from an IR camera recording a surface temperature of a P1-based photodetector before the photodetector was touched by a finger.
Figure 10B:
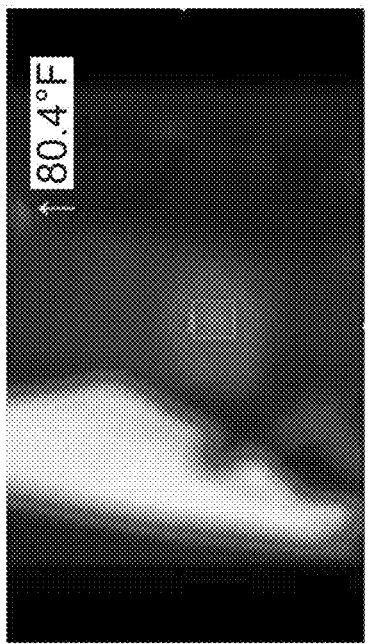
FIG. 10B shows a visual representation from an IR camera recording a surface temperature of the P1-based photodetector of FIG. 10A after the photodetector was touched by the finger.
Figure 10C:
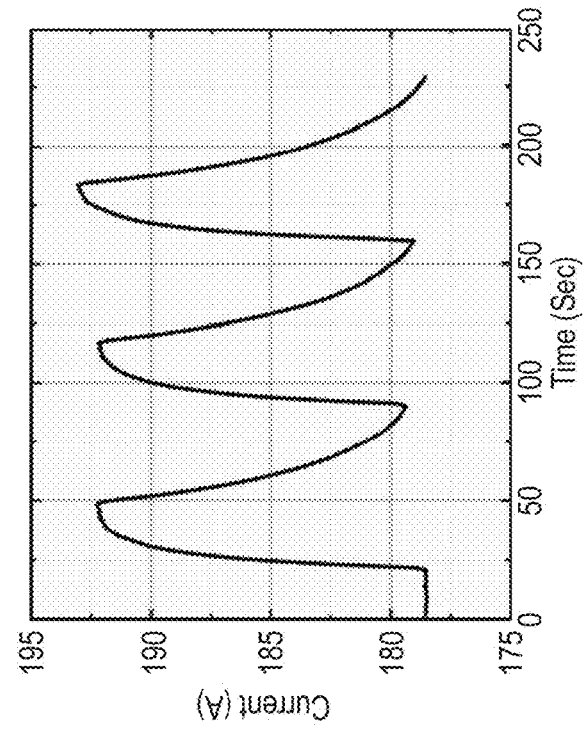
FIG. 10C shows a graphical representation of change in temperature with respect to time when the finger is approaching the photodetector of FIG. 10A.
Figure 10D:
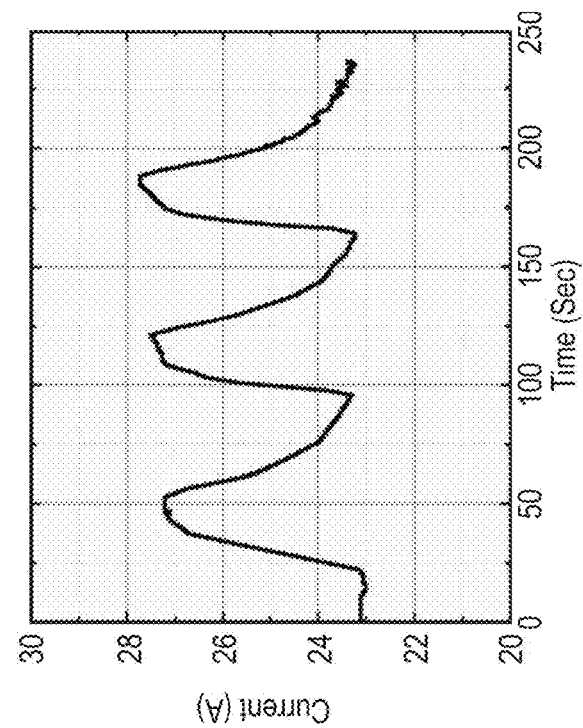
FIG. 10D shows a graphical representation of change in current with respect to time when the finger is approaching the photodetector of FIG. 10A.

The performance of the P1-based photodetector was also measured using photocurrent and dark current relative to a thickness of the polymer. As shown in FIG. 9, a P1-based photodetector was tested with an untreated substrate, and the dark current and the photocurrent were recorded in a first graph (a). A P1-based photodetector was tested with a substrate treated by octadecyltrichlorosilane (OTS), and the dark current and the photocurrent were recorded in a second graph (b). Together, the first graph (a) and the second graph (b) illustrate that the performance of a P1-based photodetector can be modulated by different substrate surface treatments as well as different film thicknesses.

A P1-based IR detector was also used as a touch sensor. The surface temperature of the detector was recorded while a finger is approaching using an infrared camera. The detector was properly biased at 5 V, and an infrared camera was set on the top of the detector. To record the electrical response of the device, a finger with an insulated glove was placed on the bottom of the detector, which was about 1 mm from the channel. FIG. 10 shows a first photo image (a) from the IR camera recording the surface temperature of the detector before the detector was touched by the finger and a second photo image (b) from the IR camera recording the surface temperature of the detector after the detector was touched by the finger. The square of the area 1 region in both the first and second photo images (a, b) represents the actual channel of the device. The color of the surface has been changed to red after introducing the finger.

FIG. 10 further includes a first graph (c) illustrating the change in temperature with respect to the time while the finger was approaching the detector and a second graph (d) illustrating the change in current with respect to the time while the finger was approaching the detector. It was observed that the surface temperature of the detector was increased by approximately 5° C. due to the finger placed about 1 mm away from the device.

Figure 11:
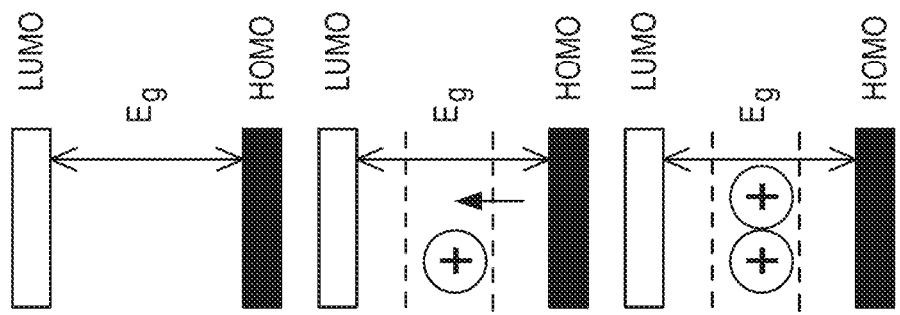
FIG. 11 shows a structure of polythiophene deposited by oxidative chemical vapor deposition.
Figure 11:
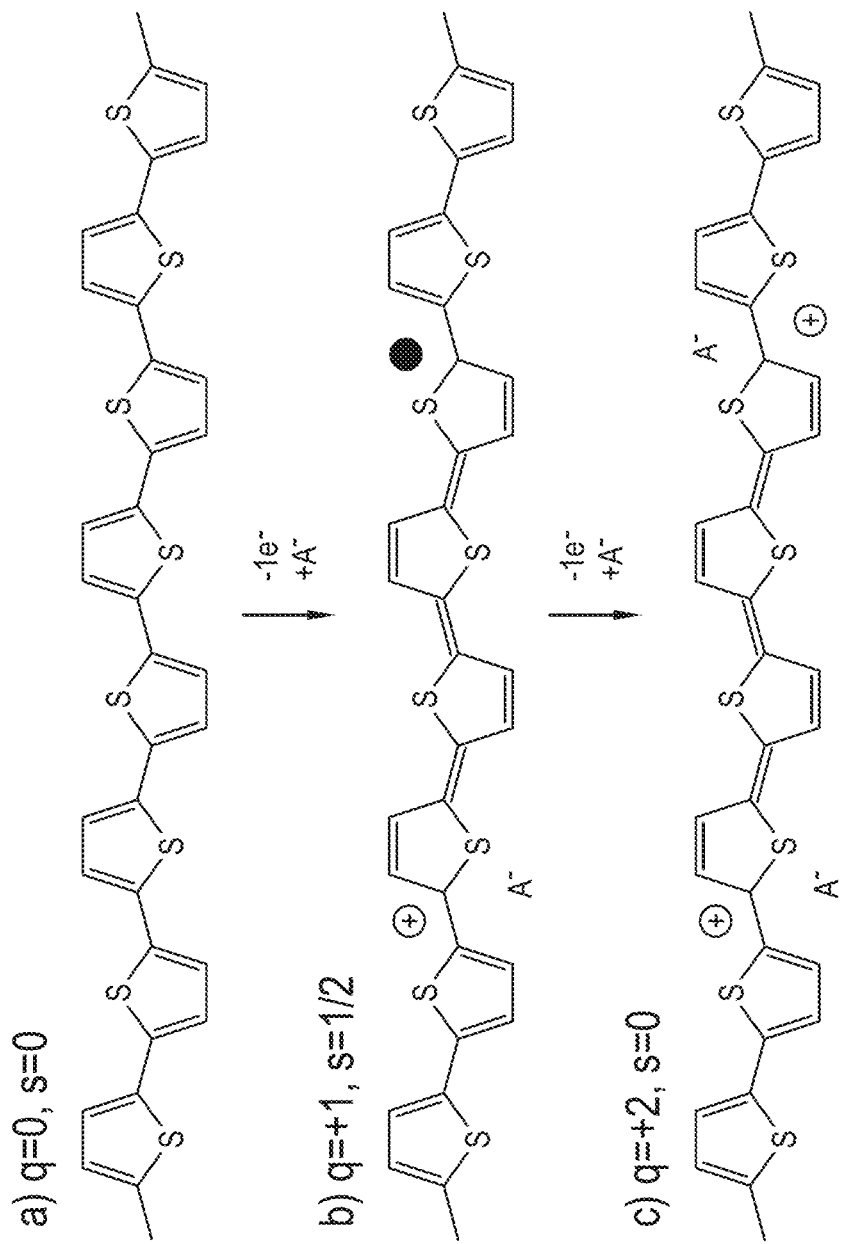

Referring to FIG. 11, an exemplary polymer structure of polythiophene deposited by oxidative chemical vapor deposition is illustrated. D⁻ represents the dopant counterion. The structure of polythiophene deposited using oxidative chemical vapor deposition (OCVD) consists nominally of a linear polymer chain with oxidized sulfur heteroatoms. Oxidation of the heteroatom occurs during the polymerization process. In the as-deposited film, the reduced oxidant (now an anion) provides a charge balance while at the same time, electrically doping the film. The actual structure of the polymer chain is branched, not linear. Other polymer structures can also be produced, including but not limited to polyaniline, polypyrrole, polyselenophene, poly(ethylenedioxythiophene), and versions of P1-P5 without solubilizing groups.

Figure 12:
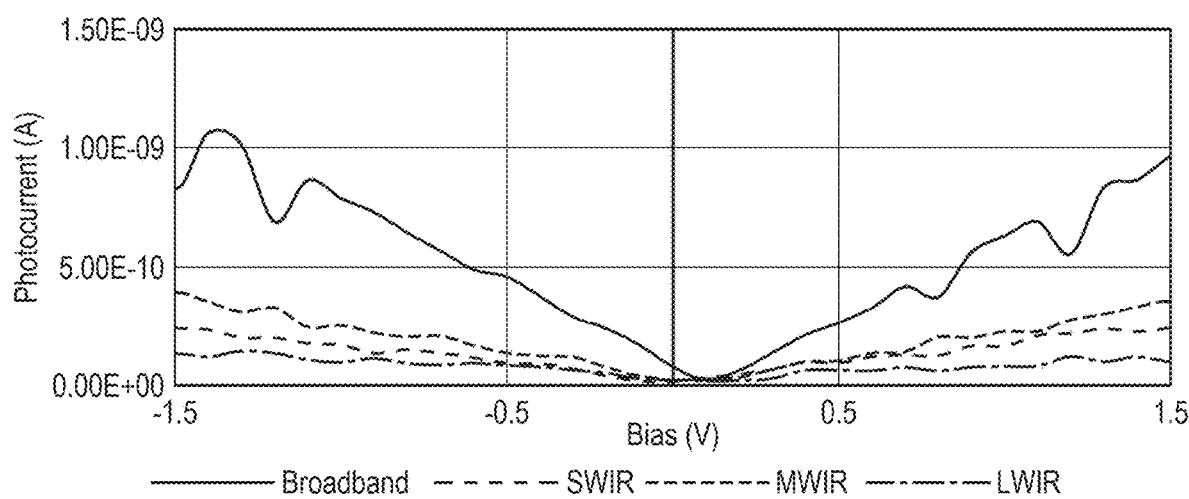
FIG. 12 shows a graphical representation of a photocurrent for an IR detector fabricated from the OCVD polythiophene of FIG. 11 excited by a 500° C. blackbody radiator.

The photocurrent IV curve of the polythiophene film was measured. FIG. 12 illustrates a photocurrent IV curve of the polythiophene film excited by a 500° C. blackbody radiator. The photocurrent IV curve shows strong photocurrents when the polythiophene film was excited by the 500° C. blackbody radiator throughout the infrared region.

In various examples, a pushbroom-type sensor or an ROIC can be electrically connected to readout circuitry for signal processing. The first stage of signal processing architecture is pulse capture electronics and digital conversion of the analog pulse. The analog pulse or the detector analog signal from the ROIC can be routed through preamplifier circuitry before entering a cascaded amplifier for formatting the signal. This changes the charge produced by the infrared detector to a voltage signal suitable for amplification. The multi-stage or cascaded amplifier can amplify the signal amplitude. When the signal amplitude is suitable for digitization, it can be sent to an "n" bit analog to digital converter (ADC). For example, as illustrated, the "n" may be about 10 to about 12 bits for the ADC output.

Figure 13B:
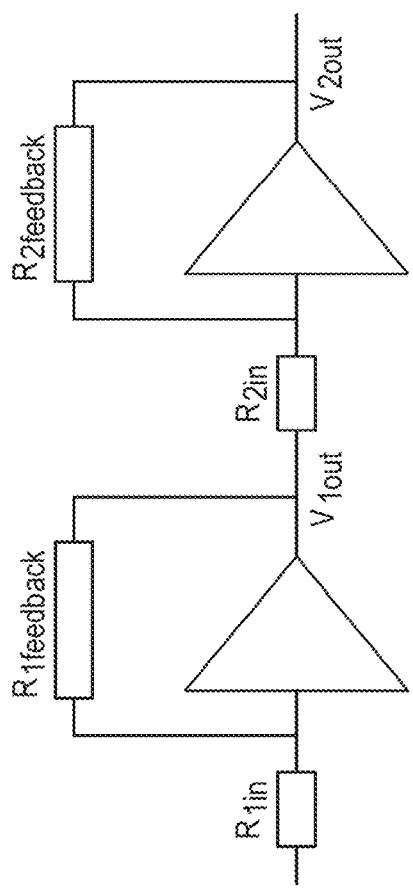
FIG. 13B is a schematic diagram illustrating a representation of a stage employed in amplifying a photoconductive detector response.
Figure 13A:
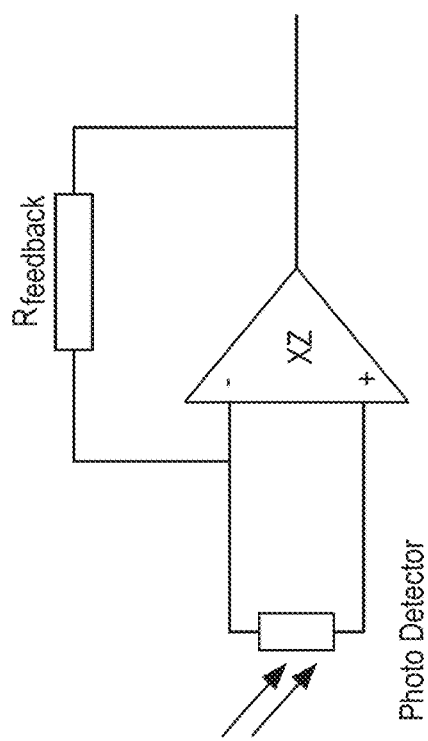
FIG. 13A is a schematic diagram illustrating a representation of a stage employed in capturing a photoconductive detector response.
Figure 13C:
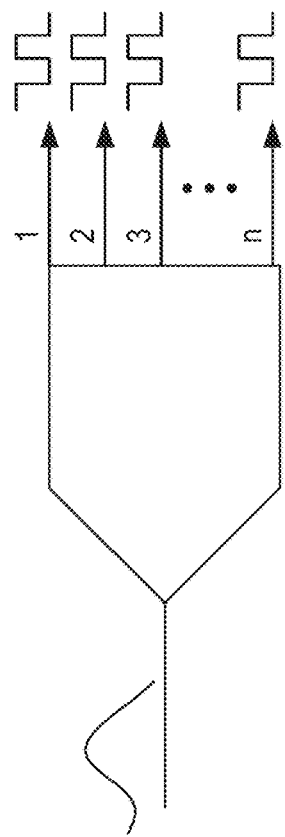
FIG. 13C is a schematic diagram illustrating a stage employed in digitizing a photoconductive detector response.

This design approach may provide built-in noise mitigation as a higher number of bits or "n" bits mitigates the quantization noise and the chopping of input signal shifts the response away from the ambient noise to the chopping frequency. FIG. 13 shows notional designs of various possible stages employed in digitization of the detector response.

After digitization of the detector response, detector response data can be routed into a Field Programmable Gate Array (FPGA) for formatting the array response. The data can also be filtered further for a targeted spectral response and multiplexed for sending to a PC or computer-based or computer processor-based device for image synthesis.

The invention design may be configured to provide development of a custom, reconfigurable architecture for a signal processing subsystem for IR imaging. This architecture can be designed to have a smaller footprint and lower costs than current commercial systems used for IR imaging. The low C-SWAP for this architecture design makes it suitable for attritable and expendable platforms. The concept allows the use of the same subsystem through lab, field, and flight testing and provides a clear path for technology transition. Moreover, it may provide the capability to interface, control, and test the ROIC from multiple ROIC designers.

The photodetectors as disclosed herein are configured to operate using IR PT using DA conjugated polymer active layers with broadband operation throughout the SWIR, MWIR, and LWIR and may be configured to be used in optoelectronics devices in the consumer electronics, automobiles, power generation/consumption, medical, military/defense and remote sensing markets.

All parameters presented herein including, but not limited to, sizes, dimensions, times, temperatures, pressures, amounts, ranges, thicknesses, distances, quantities, ratios, weights, volumes, percentages, and/or similar features and data and the like, for example, represent approximate values and can vary with the possible embodiments described and those not necessarily described but encompassed by the invention. For example, the phrase "generally less than 1.0 mm" means generally less than about 1.0 mm, unless a specific parameter is described or understood as required. Unless defined otherwise, all technical and scientific terms used herein have the same meaning as commonly understood to one of ordinary skill in the art to which this invention belongs. Further, references to the singular forms "a", "an", and "the" concerning any particular item, component, material, or product include plural references and are defined as at least one and could be more than one, unless the context clearly dictates otherwise. The terminology employed is for the purpose of describing particular embodiments and is not intended to be limiting in any way.

The above detailed description and the information included in the attached document are presented to enable any person skilled in the art to make and use the invention. Specific details have been revealed to provide a comprehensive understanding of the present invention and are used for explanation of the information provided. These specific details, however, are not required to practice the invention, as is apparent to one skilled in the art. Descriptions of specific applications, examples, details, analyses, materials, components, dimensions, and calculations are meant to serve only as representative examples. Various modifications to the preferred embodiments may be readily apparent to one skilled in the art, and the general principles defined herein may be applicable to other embodiments and applications while still remaining within the scope of the invention. Moreover, some features of the invention may be employed without a corresponding use of the other features. There is no intention for the present invention to be limited to the embodiments shown and the invention is to be accorded the widest possible scope consistent with the principles and features disclosed herein.

While various embodiments of the present invention have been described above and in the attached document, it should be understood that they have been presented by way of example and not limitation. It will be apparent to persons skilled in the relevant art(s) that various changes in form and detail can be made therein without departing from the spirit and scope of the present invention. In fact, after reading the above description, it will be apparent to one skilled in the relevant art(s) how to implement the invention in alternative embodiments. The preferred embodiments of the invention have been described herein, but it should be understood that the broadest scope of the invention includes such modifications as additional or different methods and materials. Many other advantages of the invention will be apparent to those skilled in the art from the above descriptions and the subsequent preferred embodiments and/or claims. Thus, the present invention should not be limited by any of the above-described exemplary embodiments.

The compositions, materials, products, processes, apparatus, systems, and methods of the present invention are often best practiced by empirically determining the appropriate values of the operating parameters, or by conducting simulations to arrive at best design for a given application. Accordingly, all suitable modifications, combinations, and equivalents should be considered as falling within the spirit and scope of the invention.

What is claimed is:

1. A photoconductive detector with an organic active layer comprising:
    a substrate;
    an electrode geometry positioned on the substrate and including:
        a first transmission line having a terminal end;
        a second transmission line having a terminal end, wherein the first and second transmission lines are spaced apart to define a gap, the gap between the first and second transmission lines acting as one pixel;
    a first layer at least partially covering the gap; and
    a second layer at least partially covering the polymer, wherein the second layer is configured as an encapsulant.

2. The photoconductive detector of claim 1, wherein the second layer is formed of one of alumina, silica, zinc selenide, germanium, barium fluoride, germanium-arsenide-selenide, gallium arsenide, glass, fused silica ("quartz"), silicon, magnesium fluoride, calcium fluoride, zinc sulphide, and magnesium aluminate.

3. The photoconductive detector claim 1, wherein the first layer is formed of an oligomer or polymer with a conjugated structure, narrow bandgap, is electrically conductive, and possesses open-shell character.

4. The photoconductive detector of claim 1, wherein the first layer is a spin-coated, donor-acceptor conjugated polymer layer.

5. The photoconductive detector of claim 1, wherein the first layer is deposited by oxidative chemical vapor deposition.

6. The photoconductive detector of claim 1, further comprising:
    pulse capture electronics;
    cascaded pre-amplifier circuitry; and
    an analog-to-digital converter.

7. The photoconductive detector of claim 1, wherein the electrode geometry is biased with an RF or DC potential less than a dielectric breakdown threshold of the substrate.

8. The photoconductive detector of claim 1, wherein at least one of the first layer and the second layer is optically transparent.

9. The photoconductive detector of claim 1, further comprising:
    a contact pad operably coupled with one of the first and second transmission lines.

10. The photoconductive detector of claim 9, wherein the contact pad is formed of gold.

11. The photoconductive detector of claim 1, wherein the first and second transmission lines are formed of gold.

12. A linear detector, comprising:
    a substrate;
    an m×n dimensional array of ohmic contacts fabricated on the substrate;
    a polymer layer at least partially covering the array of ohmic contacts;
    an ohmic top electrode at least partially covering the polymer layer; and
    an encapsulant layer at least partially covering the ohmic top electrode.

13. The linear detector of claim 12, wherein the substrate is an ROIC substrate.

14. The linear detector of claim 12, further comprising:
    pulse capture electronics;
    cascaded pre-amplifier circuitry; and
    an analog-to-digital converter.

15. The linear detector of claim 12, wherein the array is biased with an RF or DC potential less than a dielectric breakdown threshold of the substrate.

16. The linear detector of claim 12, wherein at least one of the polymer layer, the top electrode, and the encapsulant layer is optically transparent.

17. The linear detector of claim 12, wherein the polymer layer is a spin-coated, donor-acceptor conjugated polymer layer.

18. The linear detector of claim 12, wherein the polymer layer is deposited by oxidative chemical vapor deposition.

19. A method of fabricating a photoconductive detector, comprising steps of:
    fabricating first and second transmission lines on a substrate to define a gap;
    spin-coating a polymer layer over at least a portion of the substrate;
    evaporating an encapsulant layer over at least a portion of the gap.

20. The method of claim 19, further comprising a step of:
    removing the polymer layer from edges of the first and second transmission lines.

21. The method of claim 19, further comprising a step of:
    fabricating a contact pad on the substrate such that the contact pad is operably coupled with one of the first and second transmission lines.

22. The method of claim 21, further comprising a step of:
    using a solvent-soaked applicator to remove the polymer layer from the contact pad.

23. The method of claim 21, further comprising a step of:
    using a shadow mask to prevent deposition of the polymer onto the contact pads.

* * * * *